United States Patent [19]

Sakitani

[11] 4,019,077
[45] Apr. 19, 1977

[54] FIELD EMISSION ELECTRON GUN

[75] Inventor: Yoshio Sakitani, Ohimachi, Japan

[73] Assignee: Hitachi, Ltd., Japan

[22] Filed: Dec. 19, 1975

[21] Appl. No.: 642,611

[30] Foreign Application Priority Data

Dec. 20, 1974   Japan .............................. 49-145576

[52] U.S. Cl. ................................ 313/178; 313/180; 313/310; 313/15

[51] Int. Cl.² ........................................ H01J 19/70

[58] Field of Search ............................ 313/178, 180

[56] References Cited

UNITED STATES PATENTS 3,374,386   3/1968   Charbonnier et al. ......... 313/178 X Primary Examiner—Rudolph V. Rolinec
Assistant Examiner—Darwin R. Hostetter
Attorney, Agent, or Firm—Craig & Antonelli

[57] ABSTRACT

A field emission electron gun capable of generating a highly stabilized electron beam, comprises a cathode tip for emitting electrons, an anode for attracting and accelerating the electrons, and means for heating the anode. A surface layer of the anode, which is to be bombarded by the electrons, consists essentially of getter material such as Zr-Al alloy. The anode heating means serves for heating the surface layer, so as to remove the absorbed gas molecules and to elevate the gettering effect of the getter material, whereby the absorbed gas molecules in the anode are hardly released therefrom, even if the anode surface is bombarded by the electrons. Therefore, the number of ions impinging on the cathode tip is remarkably reduced, and a stable electron beam can be obtained from the cathode tip.

13 Claims, 7 Drawing Figures

FIELD EMISSION ELECTRON GUN

BACKGROUND OF THE INVENTION

1. Field of the Invention

This invention relates to an improved electron gun which is suitable for use as an electron source in an electron microscope and the like, and more particularly relates to a field emission electron gun capable of generating a highly stabilized electron beam.

2. Description of the Prior Art

As is well known, the current density of the electron beam generated by a field emission electron gun is remarkably higher than that of a thermal emission electron gun. However, in a conventional field emission electron gun, the current intensity of the electron beam is apt to fluctuate under the influence of the ion impingement on the cathode tip by the ions emanating from the anode surface due to the electron bombardment by the electrons emitted from the cathode tip.

For example, a conventional field emission electron gun as shown in FIG. 1 in cross-sectional view, includes a needle-shaped cathode tip 1 for emitting electrons and is usually made of tungsten, a hair-pin shaped filament 2 for supporting and heating the cathode tip 1 and usually made of tungsten, an anode 3 having an aperture 4 and usually made of molybdenum, a high voltage DC source 5 connected between the cathode tip 1 and the anode 3 to form an electric field for field electron emission, and a vacuum container 6.

In operating the electron gun shown in FIG. 1, the vacuum container 6 is evacuated to obtain an ultra high vacuum on the order of $10^{-9} \sim 10^{-10}$ Torr therein, and a high voltage of about $1 \sim 5$ KV is applied between the cathode tip 1 and the anode 3. Then, a strong electric field of about $10^7$ V/cm is formed adjacent the top end of the cathode tip 1, whereby electrons are emitted therefrom. These emitted electrons are attracted by and accelerated toward the anode 3. Then, one part of the total number of emitted electrons passes through the aperture 4 and forms an electron beam $e_p$ as an effective output. However, another part of the total number of emitted electrons bombards the upper surface of the anode 3. Therefore, it there are absorbed gas molecules on the anode surface, the absorbed gas molecules are released and ionized by the electron bombardment. The ions thus emanated from the anode surface are attractively accelerated toward the cathode tip by the strong electric field and impinge on the tip at high speed. Therefore, the surface of the top end of the cathode tip is sputtered and roughened by the ion impingement, and the cathode tip is consumed little by little. Accordingly, the surface condition of the cathode tip varies, and the emission current fluctuates with time. In addition, as a higher electric field is locally applied to the protruding portions of the roughened surface of the cathode tip, electron emission therefrom gradually increases, and finally, a very large electron beam is emitted, and a vacuum discharge occurs. When such a condition occurs, the cathode tip is deformed or destroyed due to the large amount of Joule heat.

To avoid this problem, an anode heating technique has been proposed. In such a technique, the anode is heated by a suitable heating means so as to remove the absorbed gas molecules in the anode surface prior to the operation of the gun. As the anode heating means, in one case, an infrared lamp or a heater coil is provided near the anode for indirectly heating the anode. In another case, a thermal electron emitting filament is provided near the cathode tip for heating the anode by electron bombardment. Alternatively, a direct heating method, in which a heating current flows directly through the anode so as to heat the anode by Joule heat has also been proposed.

However, such conventional methods are not yet adequate for preventing the fluctuation of the emission current by reason that the absorbed gas molecules in the anode surface are not completely removed.

SUMMARY OF THE INVENTION

It is therefore an object of the invention to provide a field emission electron gun capable of generating a stable electron beam for a long period of time.

A further object of this invention is to provide a field emission electron gun having a long life without any deformation and destruction of the cathode tip.

In order to accomplish these objects, the field emission electron gun according to the invention is characterized in that at least one part of the anode surface directly facing to the cathode tip (more particularly, at least one part of the anode surface which is to be bombarded by the electrons emitted from the cathode tip) is made of a getter material including at least one metal element selected from the group consisting of titanium (ti), zirconium (Zr), thorium (Th) and barium (Ba). Also, anode heating means is provided for heating the anode surface so as to elevate the gettering effect of the getter material.

In the foregoing arrangement, the anode surface consisting of the getter material, which has been previously outgassed and activated by the heating means, strongly absorbs the residual gas in the vacuum. The absorbed gas molecules in the activated getter material are hardly released from the anode surface when the anode surface is bombarded by electrons emitted from the cathode tip. Therefore, the number of ions emanated from the anode surface is remarkably reduced. Thus, ion impingement on the cathode tip is prevented, and a stable electron beam is obtained.

Other objects and features of the invention will be apparent from the following detailed description when read in conjunction with the accompanying drawings.

DETAILED DESCRIPTION

Figure 1:
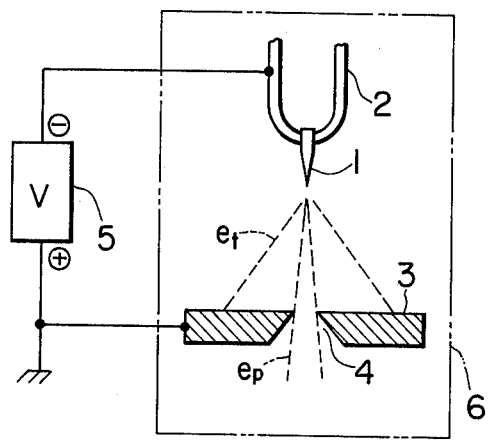
FIG. 1 is a schematic cross-sectional view of a conventional field emission electron gun.
Figure 2:
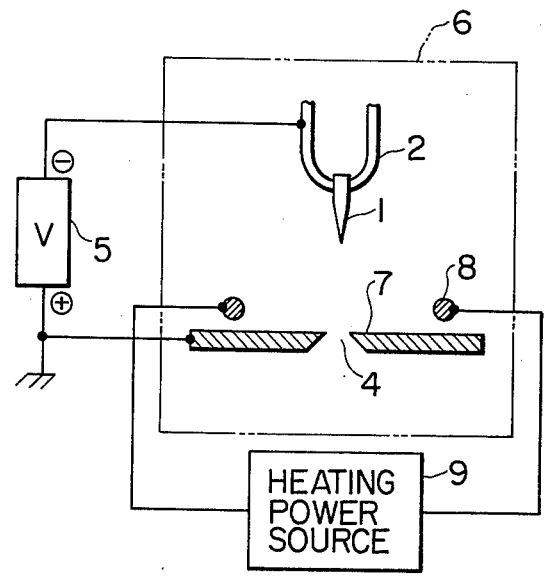
FIG. 2 is a schematic cross-sectional view of an embodiment of the field emission electron gun according to the invention.

FIG. 2 shows a field emission electron gun, according to an embodiment of the invention, which is suitable for use in a scanning electron microscope. In this figure, the electron gun structure includes a cathode tip 1 for emitting electrons, a filament 2 for supporting and heating the cathode tip 1, an anode 7 having an aperture 4, a high voltage DC source 5 connected between the cathode tip 1 and the anode 7 and a vacuum container 6. According to the invention, the anode is made of a getter material including at least one metal element selected from the group consisting of Ti, Zr, Th and Ba. In the embodiment shown in FIG. 2, the entire anode is made of Zr-Al alloy. In addition, the electron gun structure according to the invention is further provided with anode heating means for heating the anode 7. The anode heating means comprises a ring-shaped heating coil 8 disposed in the vicinity of the upper surface of the anode, and a heating power source 9 connected to the heating coil 8 for supplying a heating current thereto. In such an arrangement, the anode heating means serves to heat the anode indirectly, so as to remove the absorbed gas molecules in the anode and to elevate the gettering effect of the getter material.

In operating the electron gun shown in FIG. 2, the vacuum container 6 is evacuated to obtain a high vacuum on the order of $10^{-9} \sim 10^{-10}$ Torr. The anode 7 is then heated to high temperature (about 800° C) by the anode heating means while the evacuation is continued. Then, absorbed gas molecules in the anode are evaporated therefrom, so that the anode surface is outgassed and the getter material is activated.

After the outgassing and the activation of the anode surface have been completed, heating of the anode is stopped, and a high voltage (about 5KV) is applied between the cathode tip 1 and the anode 7. Then, a strong electric field is formed near the top end of the cathode tip 1, and electrons are emitted therefrom. In this state, since the anode has been treated for outgassing and activation, the remaining gas molecules strongly absorbed on the anode surface are hardly released when the anode surface is bombarded by the electrons emitted from the cathode tip. Moreover, the residual gas molecules in the vacuum are strongly absorbed into the activated getter material. Therefore, ion impingement onto the cathode tip hardly occurs. Thus, a highly stable electron beam is obtained, and destruction of the cathode tip is successfully prevented.

Figure 3:
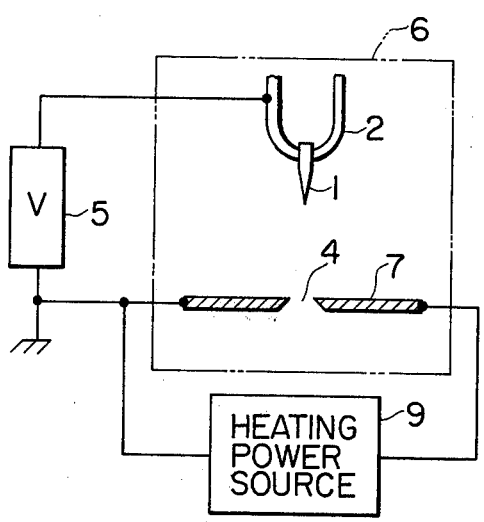
FIG. 3 is a schematic cross-sectional view of another embodiment of the field emission electron gun according to the invention.

FIG. 3 shows another embodiment of the invention, in which the anode 7 made of getter material is directly heated by Joule heating. That is, a heating current directly flows through the anode for heating the anode itself by Joule heat. For this purpose, the heating power source 9 is connected to the anode directly. In this embodiment, the electron gun structure is remarkably simplified.

Figure 4:
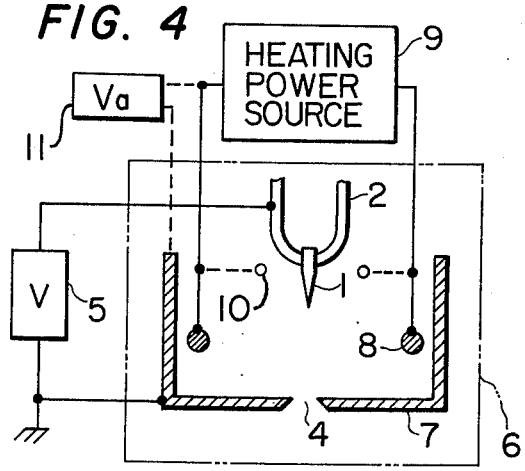
FIG. 4 is a schematic cross-sectional view of a further embodiment of the field emission electron gun according to the invention.

FIG. 4 shows a further embodiment of this invention, in which the anode 7 made of getter material has a cup-shape. In this embodiment, evaporation and ionization of the absorbed gas molecules from the inner surface of the vacuum container by the bombardment of the electrons scattered at the anode surface can be prevented.

Also shown in FIG. 4 is an alternative arrangement for heating the anode. This alternative arrangement includes a thermal electron emitting filament 10 provided near the cathode tip, and a high voltage (Va) source 11, provided for accelerating the electrons emitted from the filament toward the anode. The connections for the filament 10 and the high voltage source 11 are shown in broken line form. Where the filament 10 is employed, the heating coil 8 is omitted.

Figure 5:
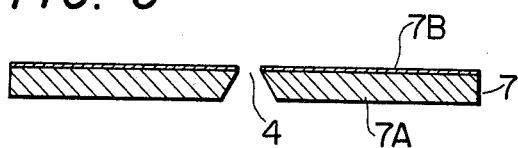
FIG. 5 is a cross-sectional view of an example of the anode construction useful in the practice of the invention.

In the above embodiments, an anode entirely made of getter material has been used, but an anode partially made of getter material may also be employed. FIG. 5 shows an example of an anode partially made of getter material, wherein the anode 7 comprises a base plate 7A consisting of a common metal such as molybdenum, and a surface layer 7B consisting of getter material such as Zr-Al alloy. The surface layer 7B is formed on the upper surface of the base plate 7A by means of various metal lining or coating methods such as lining, plating, evaporating and sputtering techniques. In this case, the anode structure is simplified, so that the anode can be manufactured economically.

Alternatively, the surface layer 7B may also be formed by a method in which a getter material (such as Ti) is evaporated or sputtered onto the upper surface of the base plate 7B in the vacuum container 6 evacuated at a high vacuum. In this case, means for evaporating or sputtering the getter material is provided in the vacuum container 6.

Figure 6:
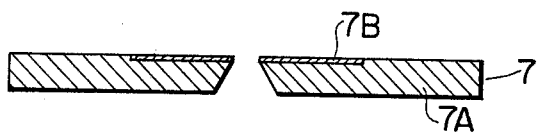
FIG. 6 is a cross-sectional view of another example of the anode construction useful in the practice of the invention.

According to the invention, an anode as shown in FIG. 6 can also be used wherein the getter material is coated on only a region 7B which is to be bombarded by the electrons emitted from the cathode tip. In this case, the anode can be manufactured economically.

Figure 7:
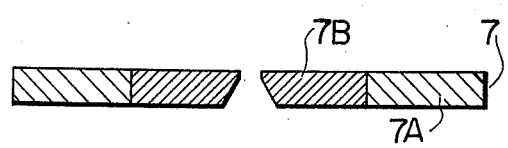
FIG. 7 is a cross-sectional view of a further example of the anode construction useful in the practice of the invention.

Furthermore, an anode as shown in FIG. 7 may also be utilized, in which the anode 7 comprises a part 7B consisting of getter material such as Zr-Al alloy, and another part 7A consisting of a common metal such as molybdenum. That is, in this case, only the part which is to be bombarded by the electrons is made of getter material.

As has been described above, according to the field emission electron gun of the invention, ion impingement onto the cathode tip is successfully prevented, so that a stable electron beam is obtained for a long period of time and destruction of the cathode tip hardly occurs.

I claim:

1. In a field emission electron gun including:
    a cathode for emitting electrons,
    an anode for attracting said electrons and toward which said electrons are accelerated, and
    a high D.C. voltage source connected between said cathode and said anode,
    the improvement wherein
    at least a portion of a surface of said anode upon which said electrons impinge is made of getter material, and
    said gun further includes means for heating said anode at a high temperature.

2. The improvement according to claim 1, wherein said getter material includes at least one component selected from the group consisting of titanium, zirconium, thorium and barium.

3. The improvement according to claim 1, wherein said getter material is zirconium-aluminum alloy.

4. The improvement according to claim 1, wherein the entirety of said anode is made of said getter material.

5. The improvement according to claim 1, wherein only a prescribed portion of said anode upon which said electrons impinge is made of getter material.

6. The improvement according to claim 5, wherein said prescribed portion of said anode comprises a surface layer of getter material.

7. The improvement according to claim 6, wherein said surface layer is a layer of getter material coated on an anode base.

8. The improvement according to claim 6, wherein said surface layer is a lining of getter material formed on said anode.

9. The improvement according to claim 7, wherein said surface layer is a coating of getter material which has been evaporated on said anode base.

10. The improvement according to claim 1, wherein said means for heating said anode comprises a heating coil disposed adjacent but spaced apart from said anode and a heating power source connected to said heating coil.

11. The improvement according to claim 1, wherein said means for heating said anode comprises a heating power source connected to said anode.

12. The improvement according to claim 1, wherein said means for heating said anode comprises a thermal electron emitting filament and a high voltage D.C. source connected between said filament and said anode.

13. The improvement according to claim 10, wherein said anode is cup-shaped and said heating coil is disposed adjacent the interior wall of said cup-shaped anode.

* * * * *